(12) United States Patent
Hasnain

(10) Patent No.: US 8,035,284 B2
(45) Date of Patent: Oct. 11, 2011

(54) DISTRIBUTED LED-BASED LIGHT SOURCE

(75) Inventor: Ghulam Hasnain, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/888,055

(22) Filed: Sep. 22, 2010

(65) Prior Publication Data

US 2011/0068672 A1    Mar. 24, 2011

(51) Int. Cl.
*H01J 7/24* (2006.01)
(52) U.S. Cl. ............................................. 313/45; 313/46
(58) Field of Classification Search .................... 313/45, 313/46
See application file for complete search history.

(56) References Cited

U.S. PATENT DOCUMENTS

| | | |
|---|---|---|
| 7,815,338 B2 | 10/2010 | Siemiet et al. |
| 7,926,975 B2 | 4/2011 | Siemiet et al. |
| 7,938,562 B2 | 5/2011 | Ivey et al. |
| 7,946,729 B2 | 5/2011 | Ivey et al. |
| 2007/0263386 A1 * | 11/2007 | Hockel et al. .................. 362/253 |
| 2010/0066229 A1 * | 3/2010 | Hamby et al. ..................... 313/1 |

* cited by examiner

*Primary Examiner* — Toan Ton
*Assistant Examiner* — Andrew Coughlin
(74) *Attorney, Agent, or Firm* — Calvin B. Ward

(57) ABSTRACT

A light source having a substrate with a plurality of component LED light generators mounted thereon is disclosed. The substrate has a first metallic surface characterized by a normal that points in a normal direction. The first metallic surface is in contact with air over the first metallic surface. The component LED light generators are mounted directly on the first metallic surface. Each component LED light generator includes an LED characterized by an operating temperature and emitting light in the normal direction. Each LED generator generates more than 0.5 watts of heat. The component LED light generators are spaced apart on the first metallic surface such that the operating temperature remains less than 75° C. above the air temperature. In one aspect of the invention, the first metallic surface surrounding each component LED light generator radiates an amount of heat equal to the heat generated by that component LED light generator.

6 Claims, 3 Drawing Sheets

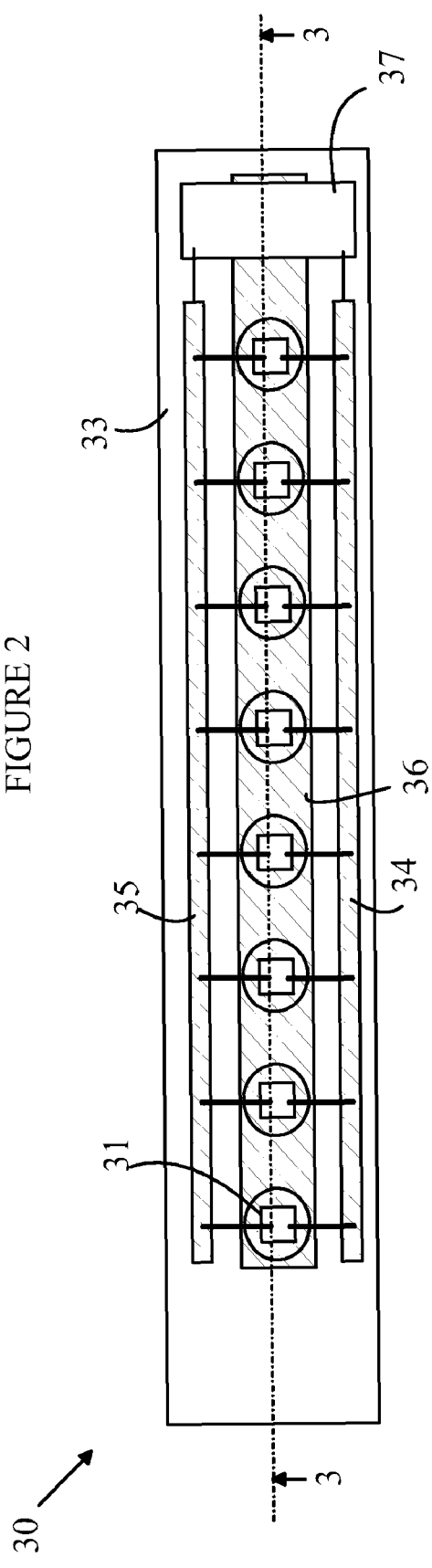
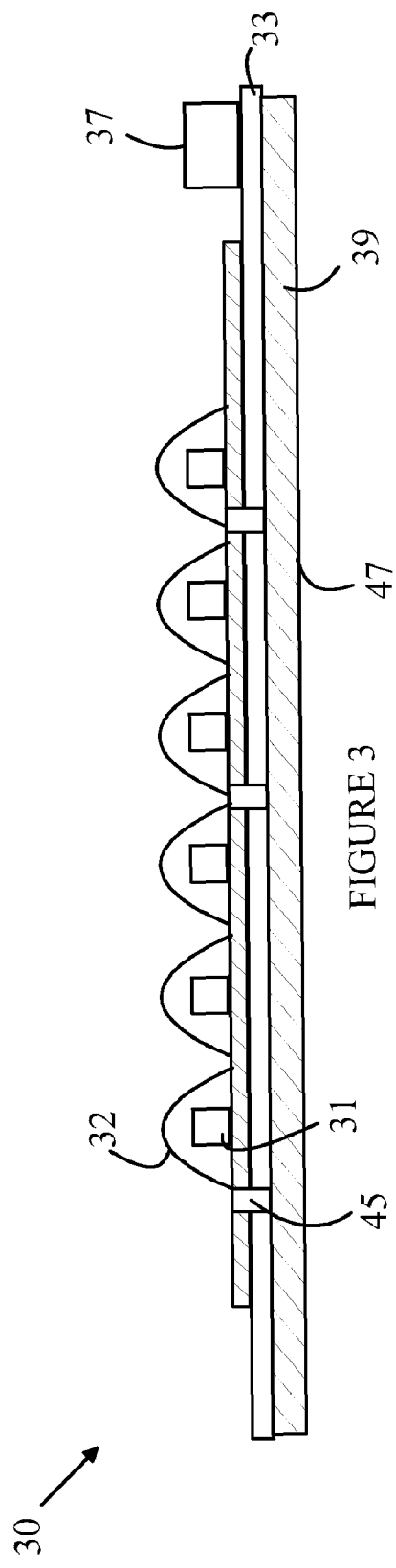

DISTRIBUTED LED-BASED LIGHT SOURCE

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes than both incandescent bulbs and fluorescent tubes. In addition, the efficiency of conversion of electricity to light has now reached the same levels as obtained in fluorescent light fixtures. Finally, since LEDs operate at relatively low voltages, issues related to the high voltages at which fluorescent light fixtures operate are substantially reduced.

The electrical conversion efficiency and lifetime of LEDs depend on the operating temperature of the LEDs. Increases in temperature lead to a loss in conversion efficiency and a lowering of the LED lifetime. Transferring the heat from the LEDs to the surrounding air is, hence, an important consideration in replacing existing high power lighting systems with LED-based light sources. Typically, LED light sources in the power range of existing fluorescent tube light sources or incandescent based light fixtures require a large heat transfer surface. The heat transfer is typically accomplished by mounting the LEDs on the front side of a carrier that has a heat-conducting bottom surface that is attached to a larger heat-radiating surface in the final light fixture. The design of the final heat-radiating system presents challenges for the light fixture manufacturer.

SUMMARY OF THE INVENTION

The present invention includes a light source having a substrate with a plurality of component LED light generators mounted thereon. The substrate has a first metallic surface characterized by a normal that points in a normal direction. The first metallic surface is in contact with air over the first metallic surface. The component LED light generators are mounted directly on the first metallic surface. Each component LED light generator includes an LED characterized by an operating temperature. Each LED generator generates more than 0.5 watts of heat. LEDs emit light that leaves the light source in the normal direction. The component LED light generators are spaced apart on the first metallic surface such that the operating temperature remains less than 75° C. above the air temperature. In one aspect of the invention, the first metallic surface surrounding each component LED light generator radiates an amount of heat equal to the heat generated by that component LED light generator.

BRIEF DESCRIPTION OF THE DRAWINGS

FIGS. 2 and 3 illustrate one embodiment of an LED-based light source according to the present invention.

DETAILED DESCRIPTION OF THE PREFERRED EMBODIMENTS OF THE INVENTION

Figure 1:
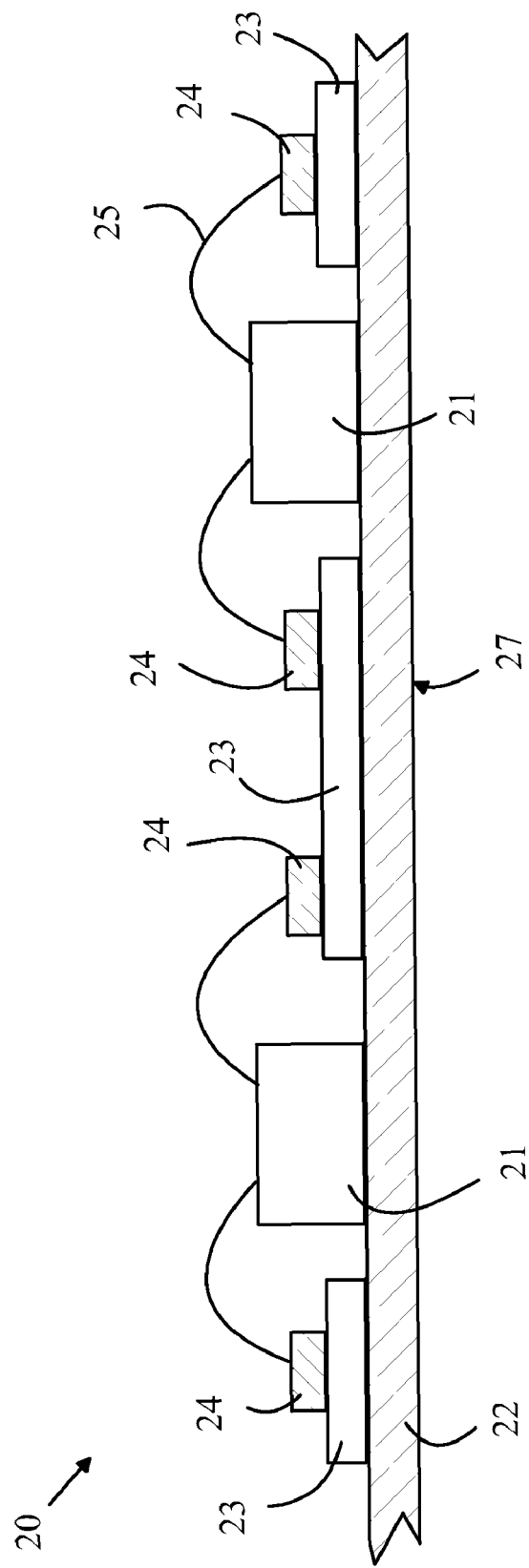
FIG. 1 is a cross-sectional view of a portion of a prior art distributed light source that could be used in large area illumination systems and backlighting applications.

The manner in which the present invention provides its advantages can be more easily understood with reference to FIG. 1, which is a cross-sectional view of a portion of a prior art distributed light source that could be used in large area illumination systems and backlighting applications. Light source 20 includes a plurality of LEDs 21 that are mounted on a heat-conducting substrate 22 such as a layer of metal that is part of a printed circuit board. Substrate 22 has an insulating layer 23 on which patterned metallic traces 24 are provided for powering the LEDs. The LEDs are connected to the traces by wire bonds such as bond 25.

Light source 20 may also include a layer of phosphor over the LEDs that converts all or part of the light from the LEDs to light having a different spectrum. For example, a layer of yellow-emitting phosphor is often used over a blue-emitting LED to create a "white" light source. To simplify the drawing, the phosphor layer has been omitted.

In applications in which light source 20 is to replace an extended illumination source such as a fluorescent tube or bank of such tubes to provide lighting over a large area, a large number of LEDs must be utilized to achieve an equivalent illumination level. Since the cost of the LEDs is significant, high power LEDs are preferred to minimize the number of LEDs that are needed. As a result, the LEDs generate a significant amount of heat that must be removed to assure that the operating temperature of the LEDs is in a satisfactory range. For example, a T12 or T8 fluorescent tube typically generates 70 to 100 lumens per inch of tube while consuming approximately 0.9 watts of power per inch of tube. Hence, an LED replacement light source needs to generate 70 to 100 lumens per inch of light source. Currently, white light sources based on GaN blue-emitting LEDs generate 70 to 100 lumens per watt. Hence, the LED replacement source will generate about 1 watt of heat for each inch along the light source to provide a replacement for the higher efficiency fluorescent tubes. If a lower efficiency fluorescent tube is being replaced, the heat that must be dissipated could be as low as 0.5 watts. On the other hand, an LED replacement light source could provide more light than existing fluorescent tubes of the length being replaced, and hence, heat dissipations in excess of 2 watts/inch of fluorescent tube could be required.

This heat needs to be dissipated without raising the temperature of the LEDs beyond the point at which an unacceptable decrease in the electrical conversion efficiency of the LEDs is incurred or a temperature at which the life of the LED is reduced. Typically, a maximum temperature of 70° C. is the operating limit; however, higher temperatures could be utilized with some LEDs, for example limits of 100° C. or 150° C. could be utilized.

In prior art high-power LED lighting applications, the heat is removed primarily through substrate 22 shown in FIG. 1. Typically, light source 20 is mounted on another surface that transfers the heat that flows through substrate 20 to a heat-dissipating surface through surface 27 that interfaces light source 20 with the ambient environment. To move the heat to the final heat-dissipating surface, a significant temperature difference between the temperature of the LEDs and the environment is needed. This temperature difference depends on the details of the final heat-dissipating surface and the airflow around that surface.

Typically, the final details of the heat-dissipating system must be provided by the lighting system designer, not the manufacturer of light source 20. This complicates the lighting system design process and increases both the cost of the lighting system and time needed to introduce a new lighting system into the market. Furthermore, in applications in which an existing extended source such as plurality of fluorescent tubes is being retro-fitted with an LED-based light system, the designer is constrained in terms of the heat-dissipating surfaces that can be utilized. For example, in applications in which light source 20 must be mounted on a poorly conducting surface such as wood or plastic, the mounting surface cannot be utilized to move the heat, no less dissipate the heat.

The present invention overcomes this problem by providing a light source that provides a power density consistent with the replacement of fluorescent tubes and a heat-dissipating system that directly removes the heat to the ambient air without requiring that the heat pass through the bottom surface of the light source.

Refer now to FIGS. 2 and 3, which illustrate one embodiment of an LED-based light source according to the present invention. FIG. 2 is a top view of light source 30, and FIG. 3 is a cross-sectional view of light source 30 through line 3-3. Light source 30 is constructed from a plurality of LEDs of which LED 31 is typical. In this embodiment, the dies emit blue light and are covered with a layer of phosphor 32 that converts a portion of the light generated by the corresponding die to light in the yellow region of the spectrum such that the light that leaves the phosphor layer is perceived as being white light of predetermined color temperature by a human observer. In this embodiment, the LEDs are connected in parallel utilizing traces 34 and 35 that are formed on an insulating layer 33. However, embodiments in which the LEDs are connected in series or more complex circuit patterns can also be accommodated. Each LED is also mounted on a heat-dissipating structure 36 that aids in the transfer of the heat generated by the LEDs to the ambient environment. The manner in which the heat is dissipated will be discussed in more detail below.

Traces 34 and 35 are powered from an interface circuit 37 that is connected to external power. The interface circuit can be part of light source 30 or a separate component. In one aspect of the invention, interface circuit 37 is also mounted on heat-dissipating structure 36 to remove heat from the interface circuit. In one aspect of the present invention, heat-dissipating structure 36 provides sufficient heat transfer to the surrounding air to maintain the temperature of the LEDs within the desired operating temperature range without the need to transfer heat through the bottom surface 47. Depending on the size of heat-dissipating structure 36 that is devoted to each LED, heat dissipation in the range of 0.5 watts to 2 watts per LED can be realized by maintaining a "footprint" that is no larger than conventional fluorescent tubes generating the same amount of light. At 2 watts per LED, the output light is significantly greater than that generated by a conventional fluorescent tube.

The heat needs to be dissipated without raising the temperature of the LEDs beyond the point at which an unacceptable decrease in the electrical conversion efficiency of the LEDs is incurred or a temperature at which the life of the LED is unacceptably reduced. The operating temperature of the LEDs, measured as that of the substrate on which the LED chips are attached, depends on the power being dissipated in the LEDs, the efficiency with which that heat is transferred to the ambient environment, and the temperature of the ambient environment. Typically, a maximum temperature of 70° C. is the operating limit; however, higher temperatures could be utilized with some LEDs, for example limits of 100° C. or 150° C. could be utilized.

In one aspect of the present invention, the LEDs are distributed on heat-dissipating structure 36 such that the surface area presented by the heat-dissipating structure is sufficient to dissipate a significant fraction of the heat of each LED to the surrounding air without the use of finned heat radiators or direct connections to larger heat-radiating surfaces. In one embodiment, the LEDs are distributed such that the heat generated on heat-dissipating structure 36 is less than 1 watt per square inch of surface area on the top surface of heat-dissipating structure 36. This arrangement is well matched to existing fluorescent tubes. A T12 fluorescent tube has a diameter of 1.5 inches; hence, a heat-radiating surface of about 1.5 square inches per inch of fluorescent tube being replaced could be made available. It has been determined experimentally, that if the LEDs are spaced apart along the length of heat-dissipating structure 36, between 0.5 and 1 watt of heat per square inch of surface area can be dissipated without raising the temperature of the LEDs by more than 30° C. above ambient.

Referring to FIG. 3, if additional heat dissipation is required and the back surface of light source 30 is to be mounted such that heat can be moved to the environment by the back surface, an additional heat-dissipating surface 47 on the backside of the light source can be utilized. In one aspect of the present invention, light source 30 includes a metallic layer 39 that is separated from heat-dissipating structure 36 by insulating layer 33. In one aspect of the invention, a metal layer is connected to heat-dissipating structure 36 by vertical heat-conducting areas such as the metal filled via shown at 45. In another aspect of the invention, heat-dissipating structure 36 is part of metal layer 39. In this case, insulating layer 33 is absent from the area under heat-dissipating structure 36. However, for many applications, this additional heat transfer is not needed.

Refer again to FIG. 2. For example, if the substrate has a heat-radiating surface that dissipates the heat to the surrounding air such as the surface of heat-dissipating structure 36, the present invention limits the LED density such that the heat generated on each square inch of heat-dissipating surface is less than 2 watts and preferably less than 1 watt; while accommodating LEDs that dissipate at least 0.5 watts of heat per second. It should be noted that the relative sizes of heat-dissipating structure 36 and traces 34 and 35 are not shown to scale. In practice, the width of heat-dissipating structure 36 is substantially equal to the width of the light source. Hence, if LEDs having a power dissipation of 1.5 watts each are mounted at one inch spacing on heat-dissipating structure 36 and heat-dissipating structure 36 is 1.5 inches wide, each LED will be surrounded by an area of 1.5 square inches of heat-dissipating surface. This maintains the power density at a level of 1 watt per square inch while dissipating substantially all of the heat to the air on the same side of the LED as the light leaves the die.

The above-described embodiments of the present invention have utilized a design requirement that the temperature rise of the LEDs is held to less than 75° C. over ambient. However, embodiments in which the design criterion is greater or less than this amount could also be utilized. For example, the replacement light sources could be constructed such that the maximum increase in temperature over ambient is 20° C., 30° C., 40° C., 50° C., 60° C., or 70° C.

In the above-described embodiments, the light sources utilize individual LED dies that are distributed on the surface of the heat-dissipating structure with the dies attached directly to the heat-dissipating structure. However, small clusters of LEDs could also be utilized provided the local heat generated is less than the power that would cause the area to increase in temperature to an unacceptable level.

Refer again to FIGS. 2 and 3. In one embodiment of the present invention, light source 30 is constructed from a metal clad printed circuit board in which the top metal is patterned to provide both the electrical traces and the heat-dissipating structure. Hence, the heat-dissipating structure is a simple planar surface that requires no additional fabrication steps or complex structures such as fins for radiating heat. If the optional bottom layer 39 is used, a circuit board having two layers is utilized. In addition, the electrical traces could be implemented on one or more metal layers that are internal to the printed circuit board.

Figure 4:
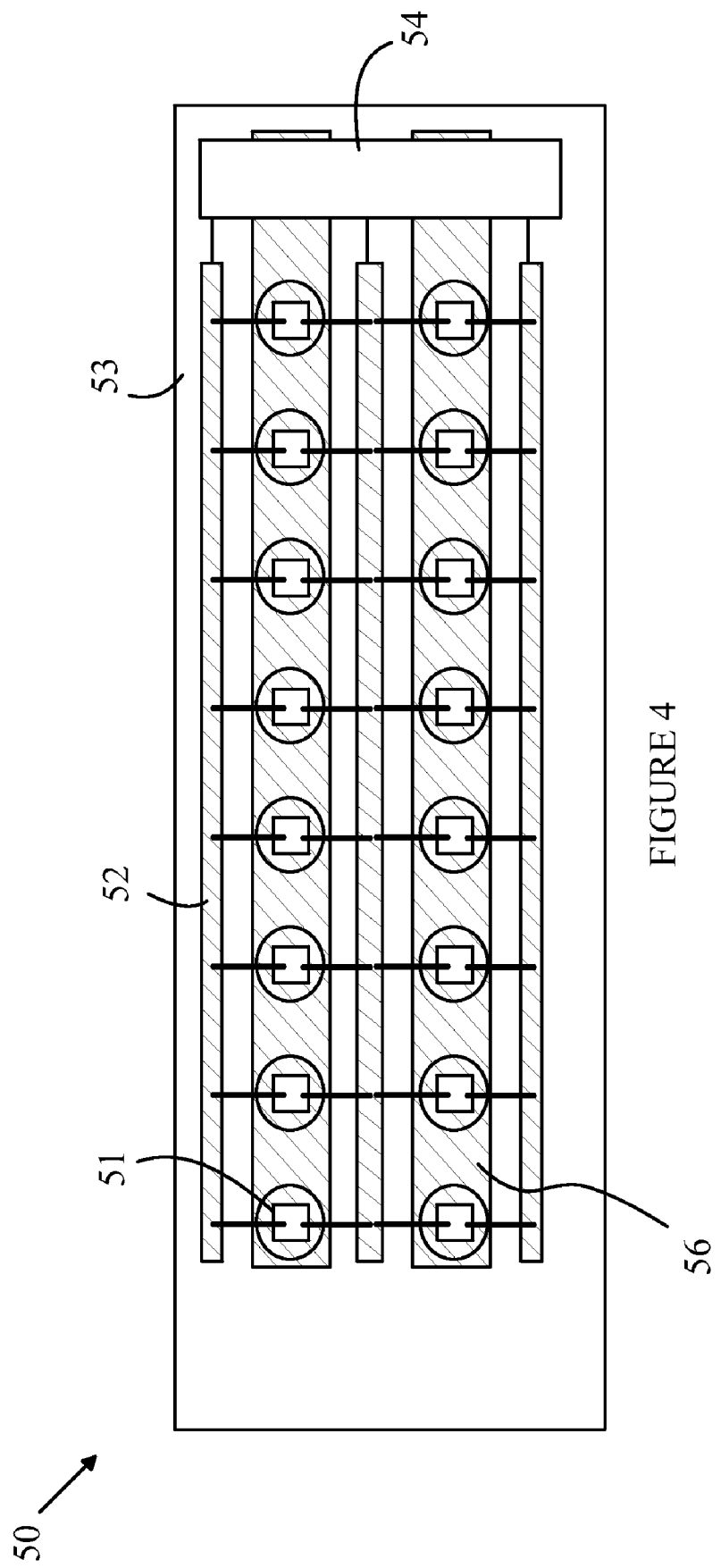
FIG. 4 illustrates another embodiment of a light source according to the present invention.

The above-described embodiments of the present invention utilized a one-dimensional array of LEDs on the heat-dissipating structure. However, embodiments in which a two-dimensional array of LEDs are placed on the heat-dissipating structure can also be constructed. Refer now to FIG. 4, which illustrates another embodiment of a light source according to the present invention. Light source 50 includes a two-dimensional array of LEDs of which LED 51 is typical. The LED dies are mounted on heat-dissipating structure 56, which is a metallic layer on the top surface of insulating layer 53. The LEDs are powered by signals on traces 52 from a power adapter 54. In this embodiment, all of the LEDs are driven in parallel; however, as noted above, other connection configurations could be utilized. In this embodiment, the spacing of the LEDs is chosen such that the heat generated by each LED can be dissipated to the air over heat-dissipating structure 56 by the portion of the metal layer surrounding that LED without causing the LED to operate a temperature above 75° C. In this embodiment, the LEDs generate between 0.5 watts and 2 watts of heat.

In the above-described embodiments, the light sources utilize individual LEDs that are distributed on the surface of the heat-dissipating structure by attaching the dies directly to the heat-dissipating structure utilizing a thermal conducting bond. However, small clusters of LEDs could also be utilized provided the local heat generated is less than the power that would cause the area to increase in temperature to an unacceptable level.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light source comprising:
   a substrate having a first metallic surface, said first metallic surface characterized by a normal that points in a normal direction, said first metallic surface being in contact with air over said first metallic surface, said air being characterized by an air temperature; and
   a plurality of component LED light generators mounted directly on said first metallic surface, each component LED light generator comprising an LED characterized by an operating temperature, each LED generator generating more than 0.5 watts of heat, said LEDs generating light that leaves said light source in said normal direction, wherein said component LED light generators are spaced apart on said first metallic surface such that said operating temperature remains less than 30° C. above said air temperature.

2. The light source of claim 1 wherein said first metallic surface surrounding each component LED light generator radiates an amount of heat equal to the heat generated by that component LED light generator.

3. The light source of claim 1 wherein said light source further comprises a second metallic surface in thermal communication with said first metallic surface and positioned to dissipate additional heat from said first metallic surface.

4. The light source of claim 1 wherein said first metallic surface is planar.

5. A light source comprising:
   a substrate having a first metallic surface, said first metallic surface characterized by a normal that points in a normal direction, said first metallic surface being in contact with air over said first metallic surface, said air being characterized by an air temperature; and
   a plurality of component LED light generators mounted directly on said first metallic surface, each component LED light generator comprising an LED characterized by an operating temperature, each LED generator generating more than 0.5 watts of heat, said LEDs generating light that leaves said light source in said normal direction, wherein said component LED light generators are spaced apart on said first metallic surface such that said operating temperature remains less than 75° C. above said air temperature,
   wherein said component LED light generators are spaced such that the heat generated on every square inch of said metallic surface which contains a LED is less than 2 watts.

6. A light source comprising:
   a substrate having a first metallic surface, said first metallic surface characterized by a normal that points in a normal direction, said first metallic surface being in contact with air over said first metallic surface, said air being characterized by an air temperature; and
   a plurality of component LED light generators mounted directly on said first metallic surface, each component LED light generator comprising an LED characterized by an operating temperature, each LED generator generating more than 0.5 watts of heat, said LEDs generating light that leaves said light source in said normal direction, wherein said component LED light generators are spaced apart on said first metallic surface such that said operating temperature remains less than 75° C. above said air temperature,
   wherein said component LED light generators are spaced such that the heat generated on every square inch of said metallic surface which contains a LED is less than 1 watt.

* * * * *